(12) United States Patent
Gorobets et al.

(10) Patent No.: US 12,136,462 B2
(45) Date of Patent: Nov. 5, 2024

(54) STORAGE SYSTEM AND METHOD FOR IMPROVING READ LATENCY DURING MIXED READ/WRITE OPERATIONS

(71) Applicant: Western Digital Technologies, Inc., San Jose, CA (US)

(72) Inventors: Sergey Anatolievich Gorobets, Edinburgh (GB); Alan Bennett, Edinburgh (GB)

(73) Assignee: Sandisk Technologies, Inc., Milpitas, CA (US)

( * ) Notice: Subject to any disclaimer, the term of this patent is extended or adjusted under 35 U.S.C. 154(b) by 226 days.

(21) Appl. No.: 17/687,875

(22) Filed: Mar. 7, 2022

(65) Prior Publication Data
US 2023/0282294 A1 Sep. 7, 2023

(51) Int. Cl.
| | | |
|---|---|---|
| *G11C 16/10* | (2006.01) | |
| *G11C 7/10* | (2006.01) | |
| *G11C 16/04* | (2006.01) | |
| *G11C 16/08* | (2006.01) | |
| *G11C 16/26* | (2006.01) | |
| *G11C 16/32* | (2006.01) | |
| *G11C 16/34* | (2006.01) | |

(52) U.S. Cl.
CPC .......... *G11C 16/3459* (2013.01); *G11C 7/106* (2013.01); *G11C 7/1087* (2013.01); *G11C 16/0483* (2013.01); *G11C 16/08* (2013.01); *G11C 16/102* (2013.01); *G11C 16/26* (2013.01); *G11C 16/32* (2013.01); *G11C 16/3481* (2013.01)

(58) Field of Classification Search
CPC ... G11C 7/1087; G11C 16/0483; G11C 16/08; G11C 16/102; G11C 16/26; G11C 16/32; G11C 16/3481; G11C 2029/0411; G11C 16/10
See application file for complete search history.

(56) References Cited

U.S. PATENT DOCUMENTS

| | | |
|---|---|---|
| 7,345,928 B2 | 3/2008 | Li |
| 8,132,045 B2 | 3/2012 | Avila et al. |
| 8,966,205 B1 * | 2/2015 | Lo ..................... G06F 12/0246 711/165 |
| 9,053,810 B2 | 6/2015 | Dutta et al. |
| 9,530,491 B1 * | 12/2016 | Uttarwar ................ G11C 16/10 |
| 9,740,419 B2 | 8/2017 | Wakchaure et al. |
| 10,748,624 B2 | 8/2020 | Bonitz |

(Continued)

OTHER PUBLICATIONS

Non-final Office Action mailed Jul. 18, 2023 for U.S. Appl. No. 17/553,024.

*Primary Examiner* — Mushfique Siddique
(74) *Attorney, Agent, or Firm* — Crowell & Moring LLP

(57) ABSTRACT

A storage system receives a request to read data that is located in a wordline undergoing a program operation. Instead of waiting for the program operation to complete, which would increase read latency, the storage system aborts the program operation and reconstructs the data from successfully-programmed memory cells in the wordline and from data latches associated with unsuccessfully-programmed memory cells in the wordline. The reconstructed data is then sent to the host. The program abort command can be similar to one used to provide a graceful shutdown in a power-loss situation.

19 Claims, 20 Drawing Sheets

(56) References Cited

U.S. PATENT DOCUMENTS

| | | | |
|---|---|---|---|
| 11,763,905 B2* | 9/2023 | Shah | G11C 16/08 365/185.03 |
| 2003/0225875 A1* | 12/2003 | Revanuru | H04L 9/40 709/223 |
| 2011/0040925 A1* | 2/2011 | Frost | G06F 12/0246 711/E12.008 |
| 2014/0082406 A1 | 3/2014 | Erez | |
| 2014/0254264 A1* | 9/2014 | Dutta | G11C 16/10 365/185.03 |
| 2014/0281683 A1 | 9/2014 | Dusija et al. | |
| 2017/0139626 A1* | 5/2017 | Wakchaure | G06F 3/0625 |
| 2018/0011714 A1* | 1/2018 | Han | G06F 3/0685 |
| 2018/0059752 A1* | 3/2018 | Khatri | G06F 1/24 |
| 2021/0406121 A1* | 12/2021 | Sharon | G06F 3/0659 |
| 2021/0406122 A1* | 12/2021 | Sharon | G06F 11/3037 |
| 2022/0076753 A1* | 3/2022 | Sharma | G11C 16/3459 |
| 2022/0392555 A1* | 12/2022 | Mizukoshi | G11C 16/3481 |

\* cited by examiner

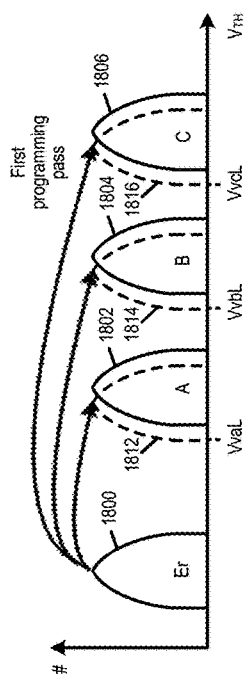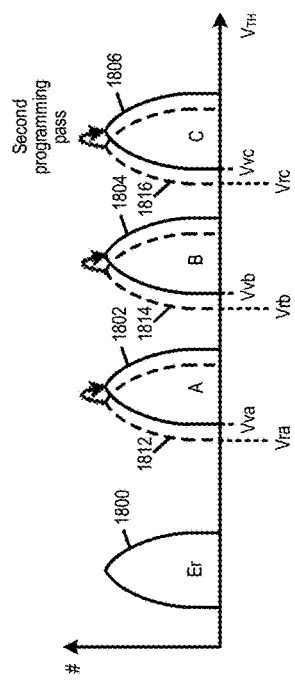
FIG. 3A (Prior Art)
FIG. 3B (Prior Art)

| p0 | p1 | p2 | p3 | |
|----|----|----|----|---|
| WL0 | WL0 | WL0 | WL0 | WL-string |
| WL1 | WL1 | WL1 | WL1 | |
| .. | .. | .. | .. | |
| .. | .. | .. | .. | |
| WLn | WLn | WLn | WLn | under program, not readable |
| .. | .. | .. | .. | |
| | | | | |
| WL0 | WL0 | WL0 | WL0 | |
| WL1 | WL1 | WL1 | WL1 | |
| .. | .. | .. | .. | |
| .. | .. | .. | .. | |
| WLn | WLn | WLn | WLn | |
| .. | .. | .. | .. | |
| | | | | |
| WL0 | WL0 | WL0 | WL0 | |
| WL1 | WL1 | WL1 | WL1 | |
| .. | .. | .. | .. | |
| .. | .. | .. | .. | |
| WLn | WLn | WLn | WLn | |
| .. | .. | .. | .. | |
| | | | | |
| WL0 | WL0 | WL0 | WL0 | |
| WL1 | WL1 | WL1 | WL1 | |
| .. | .. | .. | .. | |
| .. | .. | .. | .. | |
| WLn | WLn | WLn | WLn | |
| .. | .. | .. | .. | |
| | | | | |

FIG. 4

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| B6X4 (3255) | | | | | | | | | | | | | | | | |
| DL4 (Top) (S1, S3, S7, S11, S14) | 1 | 0 | 0 | 1 | 1 | 1 | 1 | 0 | 0 | 0 | 0 | 1 | 1 | 1 | 0 | 0 |
| DL3 (Upper) (S2, S5, S9, S13, S15) | 1 | 1 | 0 | 0 | 0 | 1 | 1 | 1 | 1 | 0 | 0 | 0 | 0 | 1 | 1 | 0 |
| DL2 (Middle) (S4, S12) | 1 | 1 | 1 | 1 | 0 | 0 | 0 | 0 | 0 | 0 | 0 | 0 | 1 | 1 | 1 | 1 |
| DL1 (Lower) (S6, S8, S10) | 1 | 1 | 1 | 1 | 1 | 1 | 0 | 0 | 1 | 1 | 0 | 0 | 0 | 0 | 0 | 0 |

FIG. 9

| | B6X4 (0255) | S0 or Successfully Programmed Cell | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|---|
| DL4 (Top) | (S1, S3, S7, S11, S14) | 1 | 0 | 0 | 1 | 1 | 1 | 1 | 0 | 0 | 0 | 0 | 1 | 1 | 1 | 0 | 0 |
| DL3 (Upper) | (S2, S5, S9, S13, S15) | 1 | 1 | 0 | 0 | 0 | 1 | 1 | 1 | 1 | 0 | 0 | 1 | 0 | 1 | 1 | 0 |
| DL2 (Middle) | (S4, S12) | 1 | 1 | 1 | 1 | 0 | 0 | 0 | 0 | 0 | 0 | 0 | 0 | 1 | 1 | 1 | 1 |
| DL1 (Lower) | (S6, S8, S10) | 1 | 1 | 1 | 1 | 1 | 1 | 0 | 0 | 1 | 1 | 0 | 0 | 0 | 0 | 0 | 0 |

FIG. 10

| Programmed Flag (PF) | uLP (SLC) | QLC LP | Recovered LP (before ECC) |
|---|---|---|---|
| 0 | 0 | 0 | 0 |
| 0 | 0 | 1 | 0 |
| 0 | 1 | 0 | 1 |
| 0 | 1 | 1 | 1 |
| 1 | 0 | 0 | 0 |
| 1 | 0 | 1 | 1 |
| 1 | 1 | 0 | 0 |
| 1 | 1 | 1 | 1 |

FIG. 13

STORAGE SYSTEM AND METHOD FOR IMPROVING READ LATENCY DURING MIXED READ/WRITE OPERATIONS

BACKGROUND

Read latency (the amount of time to read data requested by a host) is an important quality of service (QOS) metric for a storage system. Ideally, a read command is handled upon receipt by the storage system. However, if there is an ongoing program or erase operation being performed in the memory, the storage system may need to wait for that operation to complete before performing the read operation, which increases read latency. It would be advantageous to be able to perform a read operation even if a program operation is being performed. FIGS. 1A-2B are prior art in that these figures appear in prior published patent applications. However, the functionality of these components that is newly-described below is not prior art. Also, FIGS. 3A and 3B illustrate an example of prior art foggy-fine programming of a group of quad-level cell (QLC) memory cells using sixteen distributions corresponding to sixteen data states.

BRIEF DESCRIPTION OF THE DRAWINGS

FIGS. 3A and 3B are diagrams illustrating a foggy-fine programming operation of an embodiment.

FIG. 4 is an illustration of a memory undergoing programming to one of its wordlines.

FIG. 9 is an illustration of a data latch assignment and reconstruction process of an embodiment.

FIG. 10 is an illustration of a data latch assignment and reconstruction process of an embodiment in which one memory cell was successfully programmed.

FIG. 13 is a chart illustrating the use of a program flag of an embodiment.

DETAILED DESCRIPTION

Figure 1A:
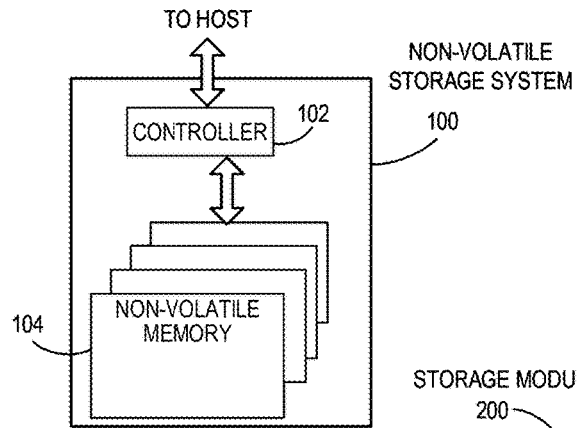
FIG. 1A is a block diagram of a non-volatile storage system of an embodiment.

The following embodiments generally relate to a storage system and method for improving read latency during mixed read/write operations. In one embodiment, a storage system is presented comprising a controller and a memory comprising data latches and a plurality of wordlines. The controller is configured to: receive a read command from a host; determine that execution of the read command requires reading a wordline that is undergoing an ongoing programming operation to program data from the data latches to the wordline; send a command to the memory, wherein the memory is configured to abort the ongoing programming operation in response to receiving the command, wherein aborting the ongoing programming operation results in some, but not all, memory cells in the wordline being successfully programmed; reconstruct the data that was to be programmed in the wordline from the data latches that correspond to memory cells in the wordline that were not successfully programmed and from the memory cells in the wordline that were successfully programmed; and send the reconstructed data to the host in response to the read command.

In another embodiment, a method is provided that is performed in a storage system comprising a controller and a memory comprising data latches and a plurality of wordlines. The method comprises: determining that execution of a read command received from a host requires reading a wordline that is undergoing an ongoing programming operation to program data from the data latches to the wordline; sending a graceful shutdown command from the controller to the memory, wherein, in response to the graceful shutdown command, the memory aborts the ongoing programming operation, which results in some, but not all, memory cells in the wordline being successfully programmed; reconstructing the data that was to be programmed in the wordline from the data latches that correspond to memory cells in the wordline that were not successfully programmed and from the memory cells in the wordline that were successfully programmed; and sending the reconstructed data to the host.

In yet another embodiment, a storage system is provided comprising: a memory comprising data latches and a plurality of wordlines; means for determining that execution of a read command received from a host requires reading a wordline that is undergoing an ongoing programming operation to program data from the data latches to the wordline; means for sending a command to the memory, wherein, in response to the command, the memory aborts the ongoing programming operation, which results in some, but not all, memory cells in the wordline being successfully programmed; means reconstructing the data that was to be programmed in the wordline from the data latches that correspond to memory cells in the wordline that were not successfully programmed and from the memory cells in the wordline that were successfully programmed; and means for sending the reconstructed data to the host.

Other embodiments are provided, and each of these embodiments can be used alone or in combination.

Turning now to the drawings, FIGS. 1A-2B are prior art in that these figures appear in prior published patent applications. However, the functionality of these components that is newly-described below is not prior art. Storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magneto-resistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including ReRAM, MRAM, PCM, NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), quad-level cell (QLC) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card-based system, such as a secure digital (SD) or a micro secure digital (micro-SD) card (or USB, SSD, etc.). In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

Figure 1B:
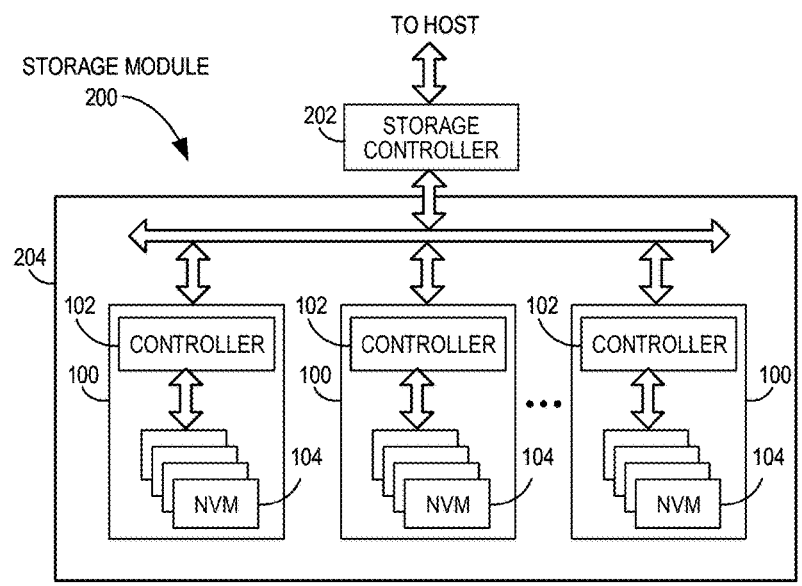
FIG. 1B is a block diagram illustrating a storage module of an embodiment.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid-state drive (SSD), or non-volatile dual in-line memory module (NVDIMM), such as found in server PC or portable computing devices, such as laptop computers, and tablet computers.

Figure 1C:
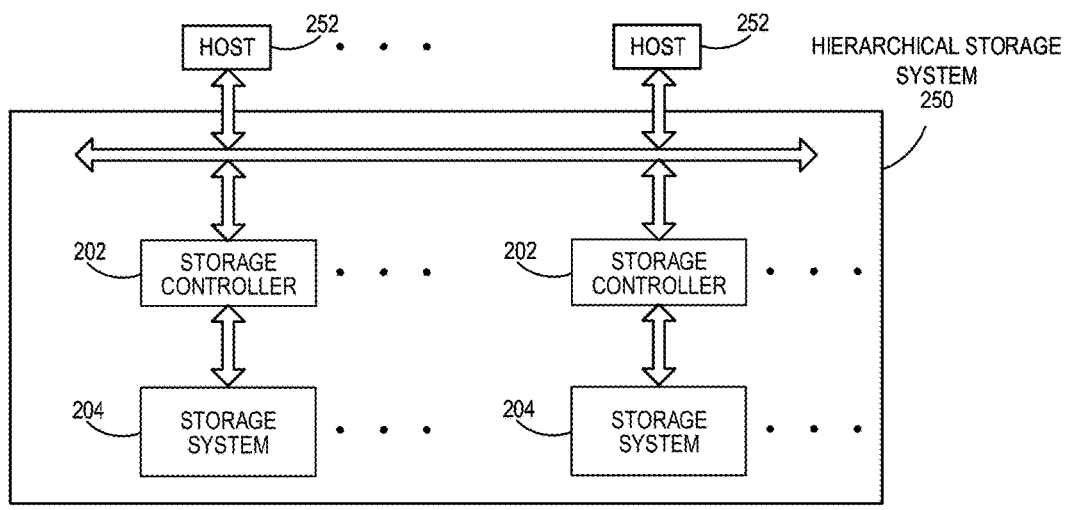
FIG. 1C is a block diagram illustrating a hierarchical storage system of an embodiment.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
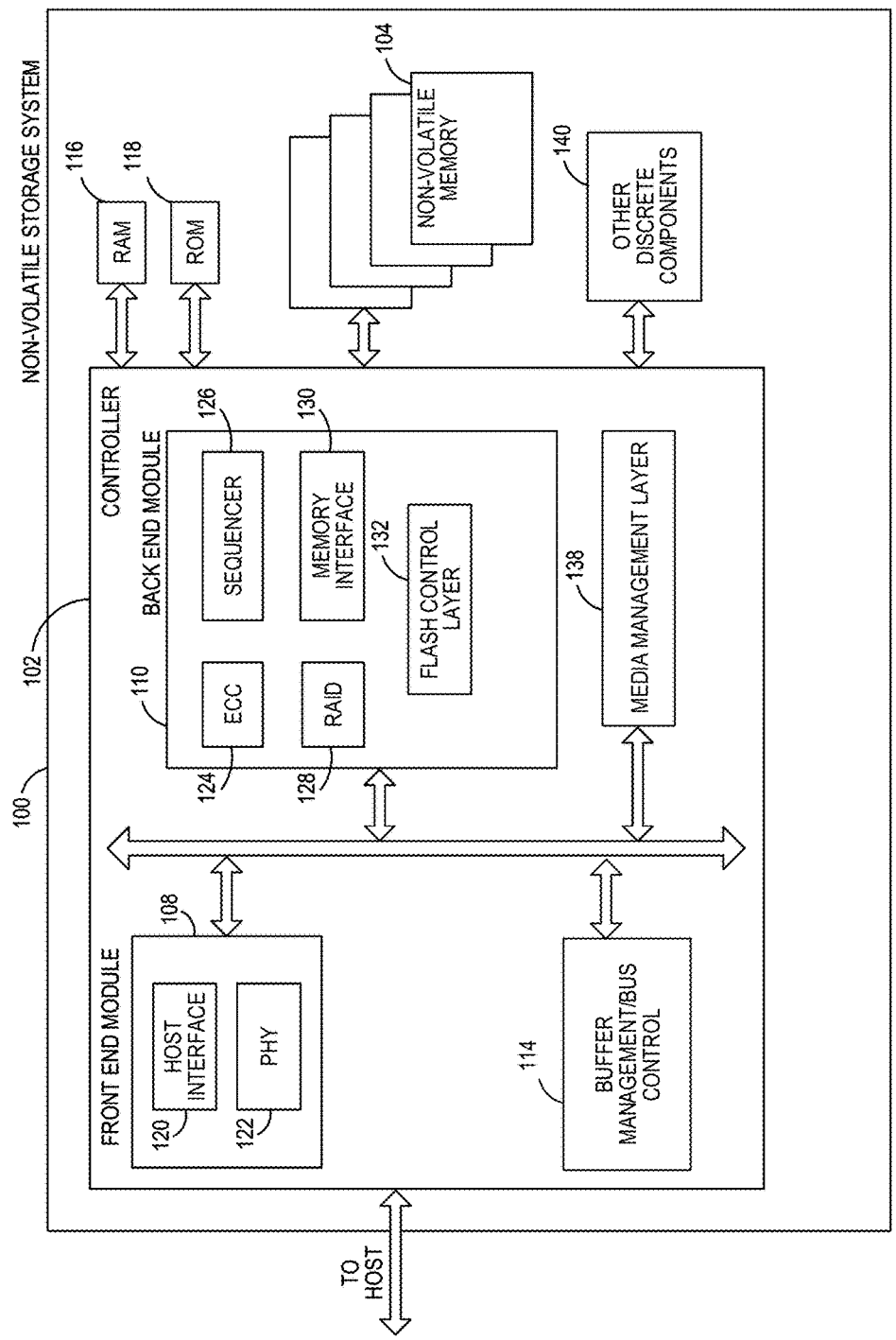
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
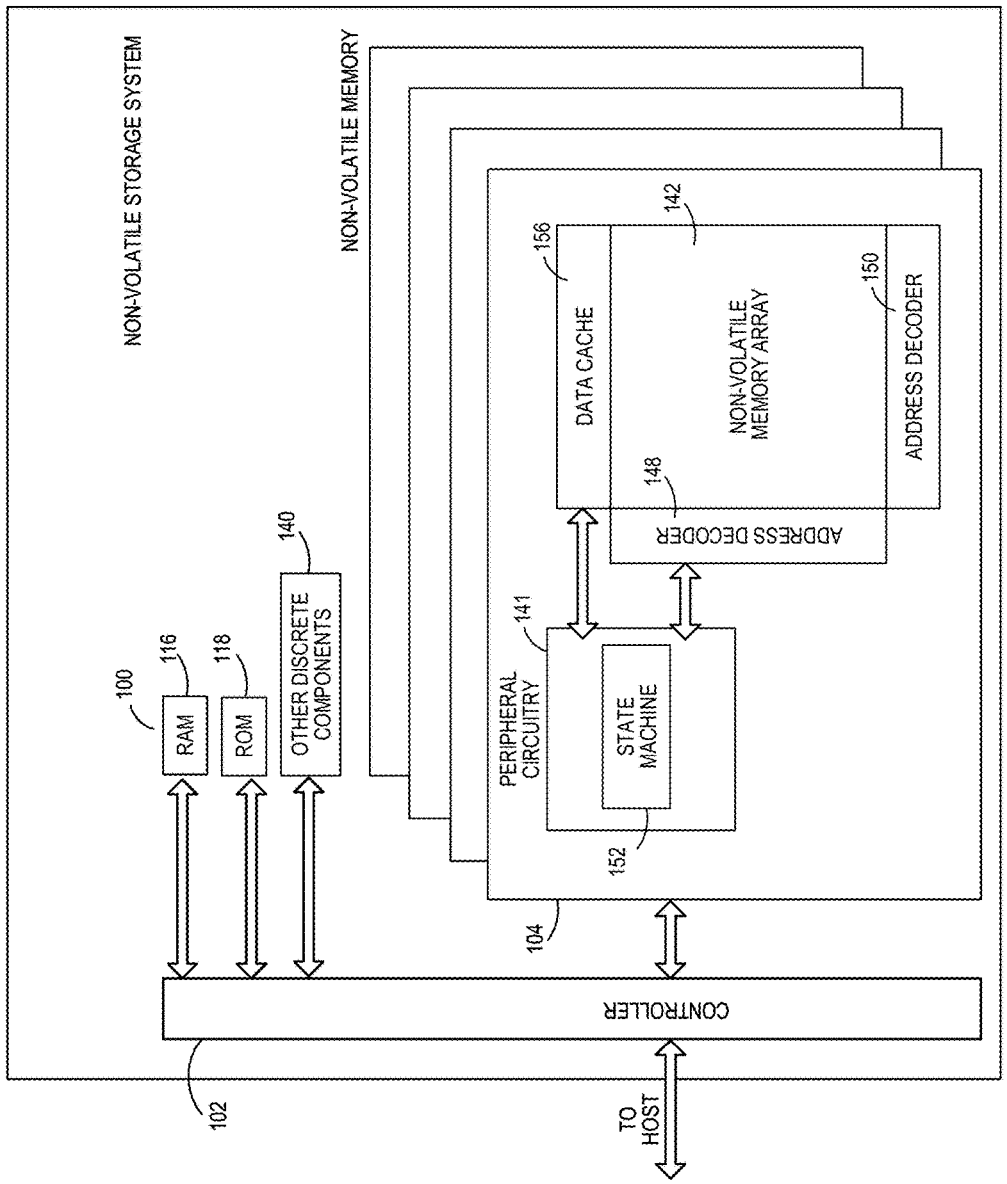
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three-dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Turning again to the drawings, FIG. 2C is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340 (e.g., DRAM)) to the storage system 100 for storage in the storage system's memory 104 (e.g., non-volatile memory dies). While the host 300 and the storage system 100 are shown as separate boxes in FIG. 2C, it should be noted that the storage system 100 can be integrated in the host 300, the storage system 100 can be removably connected to the host 300, and the storage system 100 and host 300 can communicate over a network. It should also be noted that the memory 104 can be integrated in the storage system 100 or removably connected to the storage system 100.

The memory 104 can be programmed in any suitable way. For example, a two-pass programming technique known as "foggy-fine" can be used to program one of four states in a memory cell. FIGS. 3A and 3B illustrate an example of prior art foggy-fine programming of a group of QLC memory cells using sixteen distributions corresponding to sixteen data states. All memory cells may be in an erased distribution (e.g., distribution S0) prior to foggy programming. Foggy programming programs memory cells to the first distributions S1' to S15', as shown in FIG. 3A. Fine programming subsequently programs the memory cells to the second distributions S1 to S15, as shown in FIG. 3B. There may be some time between these two program operations, and one or more other groups of memory cells may be programmed during that time. It will be understood that memory cells of a given first distribution are subsequently further programmed to a corresponding second distribution without erasing memory cells between so that fine programming does not start from the erased distribution. For example, memory cells that are programmed to the S1' distribution in a foggy program operation are subsequently further programmed to the S1 distribution in a fine program operation, memory cells that are programmed to the S2' distribution in a foggy program operation are subsequently further programmed to the S2 distribution in a fine program operation, memory cells that are programmed to the S3' distribution in a foggy program operation are subsequently further programmed to the S3 distribution in a fine program operation, and so on.

First distributions S1' to S15' are generally wider than second distributions S1-S15, and there is significant overlap between adjacent distributions (e.g., distribution S1' overlaps distribution S2', distribution S2' overlaps distribution S3', and so on), It should be noted while FIG. 3B does not show overlap in the distributions, there may be some overlap. However, because such overlap creates a relatively-small number of errors that are easily correctable with ECC, the overlap is not shown in FIG. 3B.

Figure 3C:
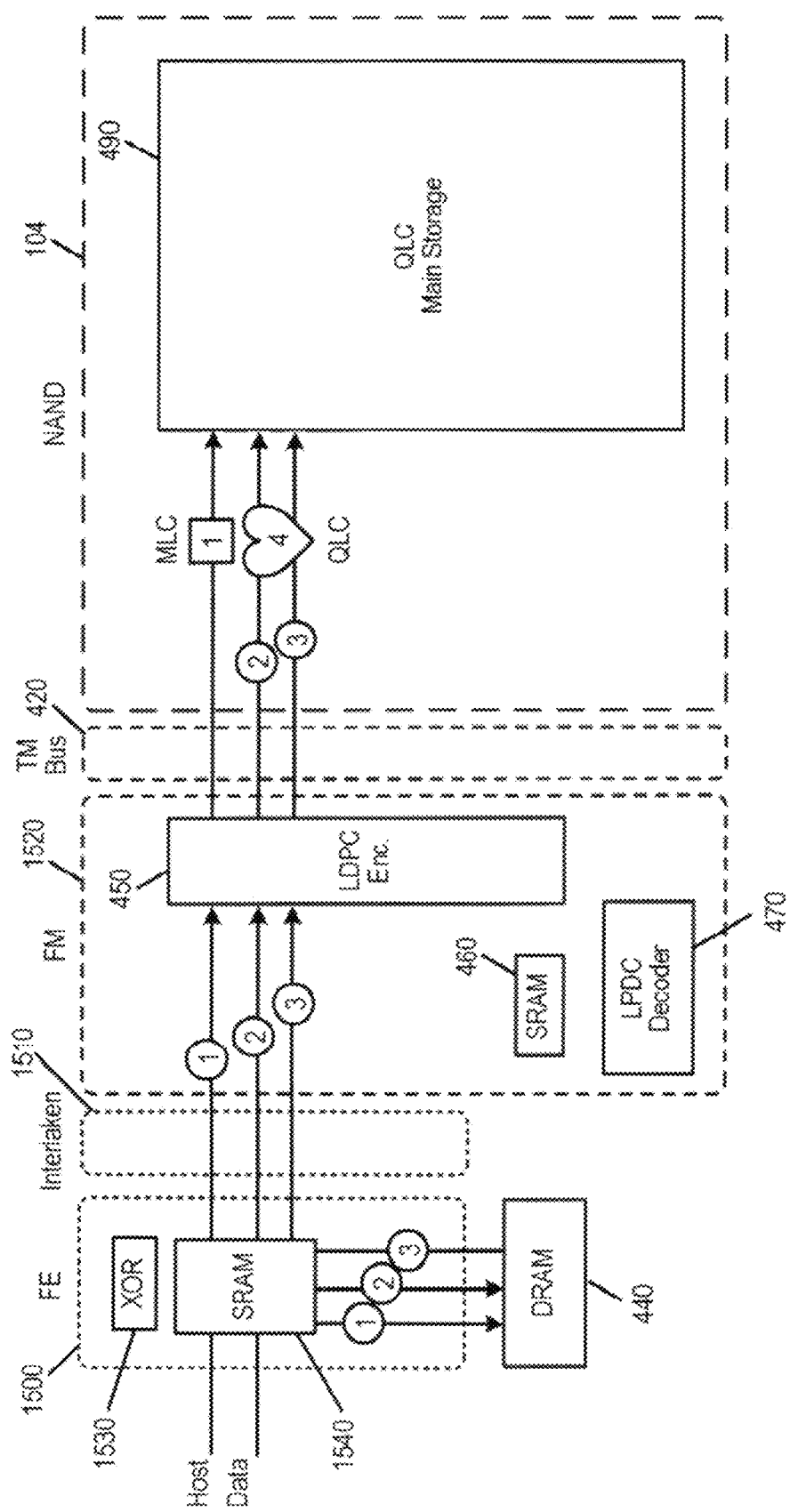
FIG. 3C is a block diagram of a storage system of an embodiment.
Figure 3D:
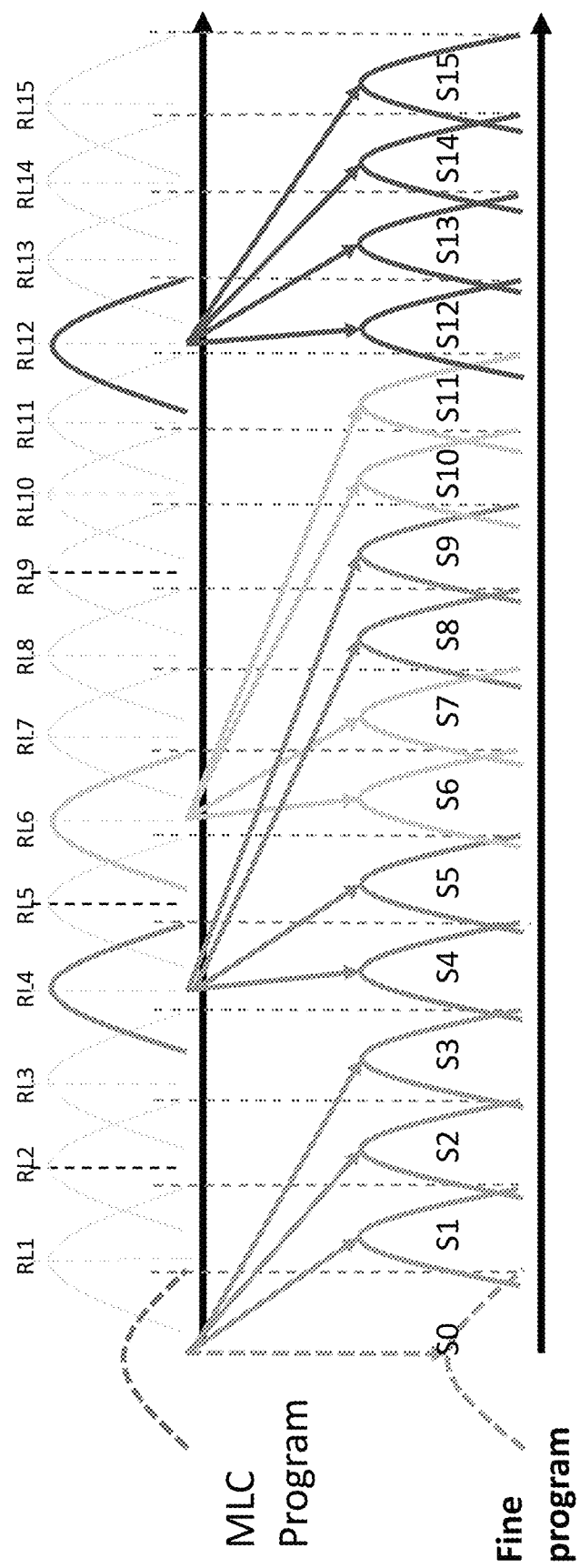
FIG. 3D is a MLC-Fine state diagram of an embodiment.

FIG. 3C is a block diagram of a storage system of an embodiment that illustrates an MLC-Fine programming data path, and FIG. 3D is a MLC-Fine state diagram of an embodiment. As shown in FIG. 3C, the storage system 100 comprises a front-end (FE) module 1500, which includes an XOR module 1530 and SRAM 1540, that is in communication with DRAM 440. The FE module 100 is in communication with a firmware (FM) module 1520 via an interlaken module 1510. The FM module 1520 comprises a low-density parity check (LDPC) encoder 450, SRAM 460, and an LDPC decoder 470. The FM module 1520 is in communication with the memory 104 (which, in this example, comprises a QLC main storage module 490) via a toggle mode (TM) bus 420.

FIG. 3C also shows multiple data paths that can be used. In Data Path 1, the storage system 100 performs a two-page host write, with stage-two pages in DRAM 440, and programs in MLC mode. In Data Path 2, the storage system 100 performs a two-page host write, with stage-two pages in DRAM 440, and two pages transferred to the data latches. In Data Path 3, two MLC pages are transferred from the DRAM 440 to the data latches. It should be noted that data need only be written to DRAM if MLC data is used for the MLC-Fine phase. In the MLC-Fine phase, the controller 102 programs two pages of data in the MLC mode first and then adds two more pages and programs in the Fine mode. All four pages of data are needed in the latches to start the Fine programming. The existing two pages (MLC) can be either sent from the controller 102 if it has a copy in DRAM or SRAM or can be read from the wordline in MLC mode, which case a copy is not needed in DRAM or SRAM. There is an alternative of reading MLC data on-chip. Finally, in Data Path 4, data is programming in the QLC memory 490 in fine mode. So, for a direct write MLC-Fine data path with IDL read, programming is done by two pages in MLC mode, followed by adding two more pages in QLC mode (internal two-page-to-four-page convergence is done by reading MLC data on-chip).

As noted above, read latency (the amount of time to read data requested by a host) can be an important quality of service (QoS) metric for a storage system. Ideally, a read command would be handled upon receipt by the storage system. However, if there is an ongoing program or erase operation being performed in the memory, the storage system may need to wait for that operation to complete before performing the read operation, which increases read latency.

To address this, the storage system can suspend the program or erase operation to handle the read request. Suspending a program operation allows the storage system to read any wordline in the memory except for the wordline that is being programmed, as the data latches for that wordlines would not contain valid data before the program operation completes. The data in the data latches (which is sometimes referred to as "in flight" data) is not exactly "just written" and cannot simply be buffered in SRAM. For example, in an enterprise-class SSD, up to ~100 devices can be under program, with 256 kilobytes (KBs) under program in each device, resulting in an unreadable data volume of about 25 megabytes (MBs). So, the storage system would need to wait until the wordline is programmed before it can read that wordline, if the data being programmed into the wordline is not backed up in RAM or other memory.

However, waiting until the wordline is programmed before it can be read increases read latency. A maximum wait time can be expressed (without overhead) as:
tPROG TLC=1.5 millisecond (ms)
tPROG QLC (MLC-Fine mode) MLC phase=1.5 ms,
tPROG QLC Fine=up to 7 ms With tPROG of 1.5 ms, the read may be acceptable for a six 9s event. However, as tPROG increases to 7 ms in QLC (fine program phase), the latency will increase dramatically and can make the storage system's read latency uncompetitive. The worst-case scenario may be one in which there is a high queue depth (QD) (e.g., a QD of 32+) with a read/write random workload, where ~70-90% of the dies are being programmed, 60% of which need more than 1.5 ms to complete. Also, as illustrated in FIG. 4, any active die is likely to have one wordline string in one of the blocks (all planes) that is not readable. This type of collision approximately corresponds to a six to seven 9s event (at a queue depth of 128). It also can be measured as the maximum latency in a one-hour test.

As noted above, instead of waiting for the program operation to complete, the storage system can cache the data under program (e.g., in a DRAM or SLC cache), so that the data can be read from there instead of waiting for programming to complete on the wordline. However, this may be a very expensive and impractical option. In other cases, the only copy of the host data under program is either in the data latches (in-flight data) or in memory cells (when the memory cells store the data in its correct, final state).

The following embodiments can be used to improve read latency in mixed read/write situations that would otherwise result in read latency in waiting for a write operation to a wordline under program to be completed before data can be read from the wordline. As will be discussed in more detail below, in one particular example, the storage system 100 uses an on-chip program failure recovery feature to implement an equivalent of a program suspend that would make the data under program readable. These embodiments can be used in any suitable write mode, including, but not limited to, any direct write mode (such as MLC-Fine QLC or full-sequence TLC) where the data is not cached in SLC blocks or DRAM. In the case of QLC MLC-Fine mode/direct write mode, these embodiments may be used only for the Fine program phase, which is relatively very long (~7 ms) and not for the MLC phase, which has about the same latency as a TLC program (~1.5 ms). These embodiments can provide the advantage of improved read latency (in some situations, up to five times (six 9s event) in mixed read-write workloads).

Figure 5:
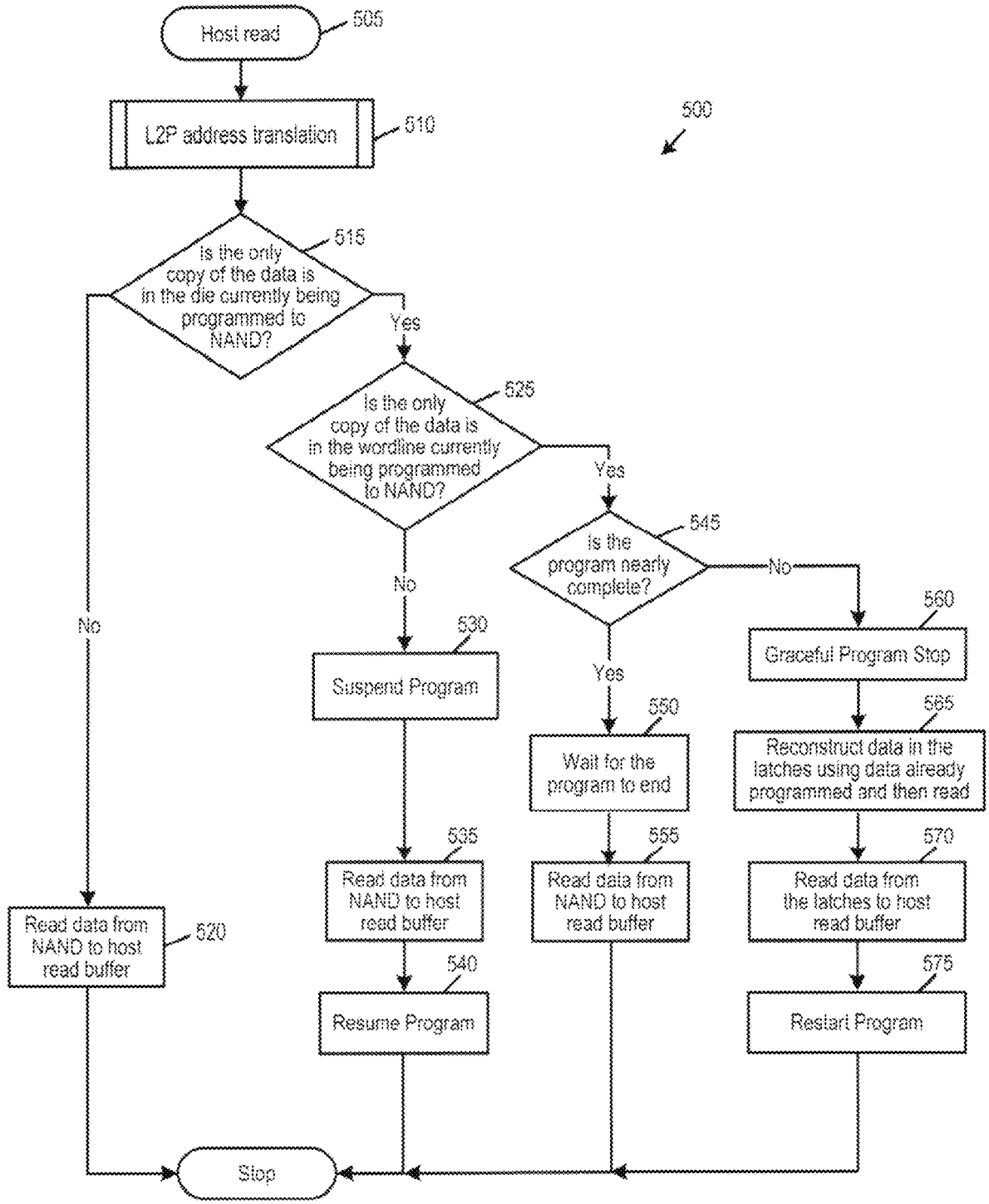
FIG. 5 is a flow chart of a method of an embodiment for improving read latency during mixed read/write operations.

Turning again to the drawings, FIG. 5 is a flow chart 500 illustrating the operation of an embodiment. As shown in FIG. 5, after the storage system 100 receives a read command from a host (act 505), the controller 102 of the storage system 100 translates the logical address in the read command to a physical address of the memory 104 (e.g., using a logical-to-physical (L2P) address translation table) (act 510). The controller 102 then determines if the only copy of the data being requested by the host is in a memory die currently being programmed (act 515). If the requested data is not in the die that is currently being programmed, there are no latency issues present caused by a program operation. So, the controller 102 reads the data from the appropriate idle die in the memory 104 and places the read data is a host read buffer before sending the data to the host (act 520). However, if the only copy of the data being requested by the host is in a memory die currently being programmed, the controller 102 determines if the only copy of the data is in the wordline that is currently being programmed (act 525).

If the only copy of the data is not in the wordline currently being programmed, the controller 102 can avoid read latency by suspending the program operation to the die (act 530), reading the data from the memory 104, and storing the data in a host read buffer (act 535). This is a normal read operation, as the partially-programmed data is in different data latches. After which, the controller 102 resumes the program operation (act 540). That is, the program operation continues where it stopped with the data not fully programmed in the latches.

However, if the only copy of the data is in the wordline that is currently being programmed, the process of suspending the programming is not applicable, as the data cannot be read from the wordline for the reasons discussed above. So, in this embodiment, the controller 102 determines if the program operation of the wordline is nearly complete (act 545). If it is, it may be more efficient to wait for the program operation to end (act 550) and thereafter read the data from the wordline (act 555). In one embodiment, this determination can be based on whether an amount of time needed to complete the ongoing programming operation exceed a threshold amount of time. In another embodiment, this determination can be based on the programming state. For example, if time needed to complete programming is less than about 200 microseconds or if programming is beyond the S13 state, the controller 102 can wait until the memory 104 completes the ongoing program operation. The controller 102 can then read the wordline when it receives a true ready signal (e.g., check status code 77 h), indicating that the program operation has finished.

If the program operation of the wordline is not nearly complete (e.g., the program operation has not yet reached the S13 state, the controller 102 can send a command to the memory 104 (act 560) that causes the memory to initiate a program suspend with read verify and an update of the latches. In this situation, the program operation would stop gracefully, after a programming pulse has ended and after a read verify and update to the latches takes place.

The data in the latches is then reconstructed using already-programmed data (act 565). Any suitable mechanism can be used to reconstruct the data, including, but not limited to, the on-chip and other solutions discussed below. The reconstructed data is then read from the latches (additional data can be saved in and read out of the latches too), corrected (if needed), and stored in the host read buffer (act 570). The data latches now contain all four pages of the original data. If the data is not there in full or not in the correct data latches, it can be transferred from the controller 102, if it has the data. The controller 102 then restarts the program operation (act 575). The programming can continue with the full original data, as we no longer know which memory cells are programmed and which are not. The memory 104 verifies that before applying the program pulse to avoid the possibility of over programming. As another option, data can be reconstructed for unprogrammed bits.

There are several advantages associated with these embodiments. For example, these embodiments can reduce latency in mixed read/write situations. In the fine phase, it is estimated that, in some situations, the delay reduction may be up to 6 milliseconds (ms) to program suspend timing (~200 microseconds plus recovery). In the MLC phase, the delay may be similar to TLC programming (e.g., 1.5 ms).

There are many alternatives that can be used with these embodiments. For example, in the above embodiments, the storage system 100 reconstructs the data under program by processing data in the memory latches and in the memory cells in the Fine phase as this is the phase of programming where it is likely that there would be no other copy of the data. In contrast, if the data needs to be read under Foggy program, the storage system 100 can read the data from another source, such as RAM or NAND. Also, if the data needs to be read under MLC program, the storage system 100 can wait for the shorter MLC program to complete or a similar reconstruction method can be used, but for only two (not four) bits. And while the above examples were based on MLC-Fine mode, the same reconstruction can be applied to the Fine phase of Foggy-Fine mode. So, these embodiments can apply to any Fine programming phase with no second data source, be it Foggy-Fine or MLC-Fine mode.

Figure 3E:
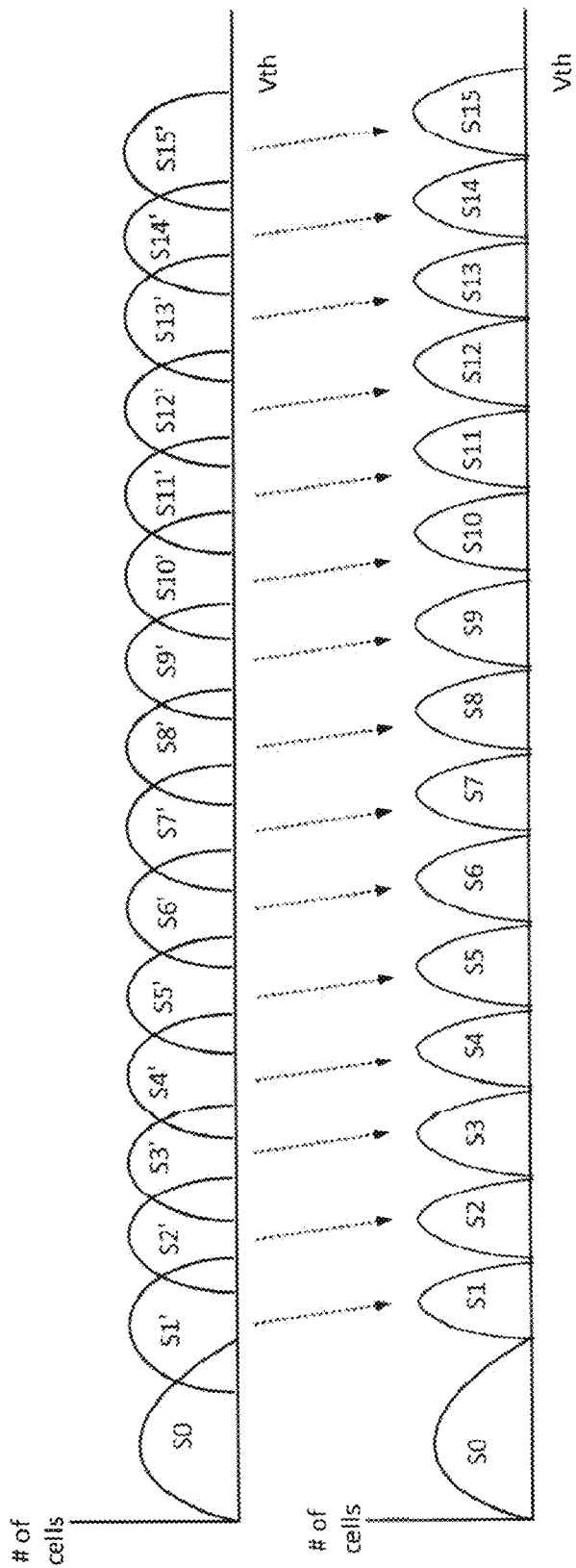
FIG. 3E is a Foggy-Fine state diagram of an embodiment.
Figure 3F:
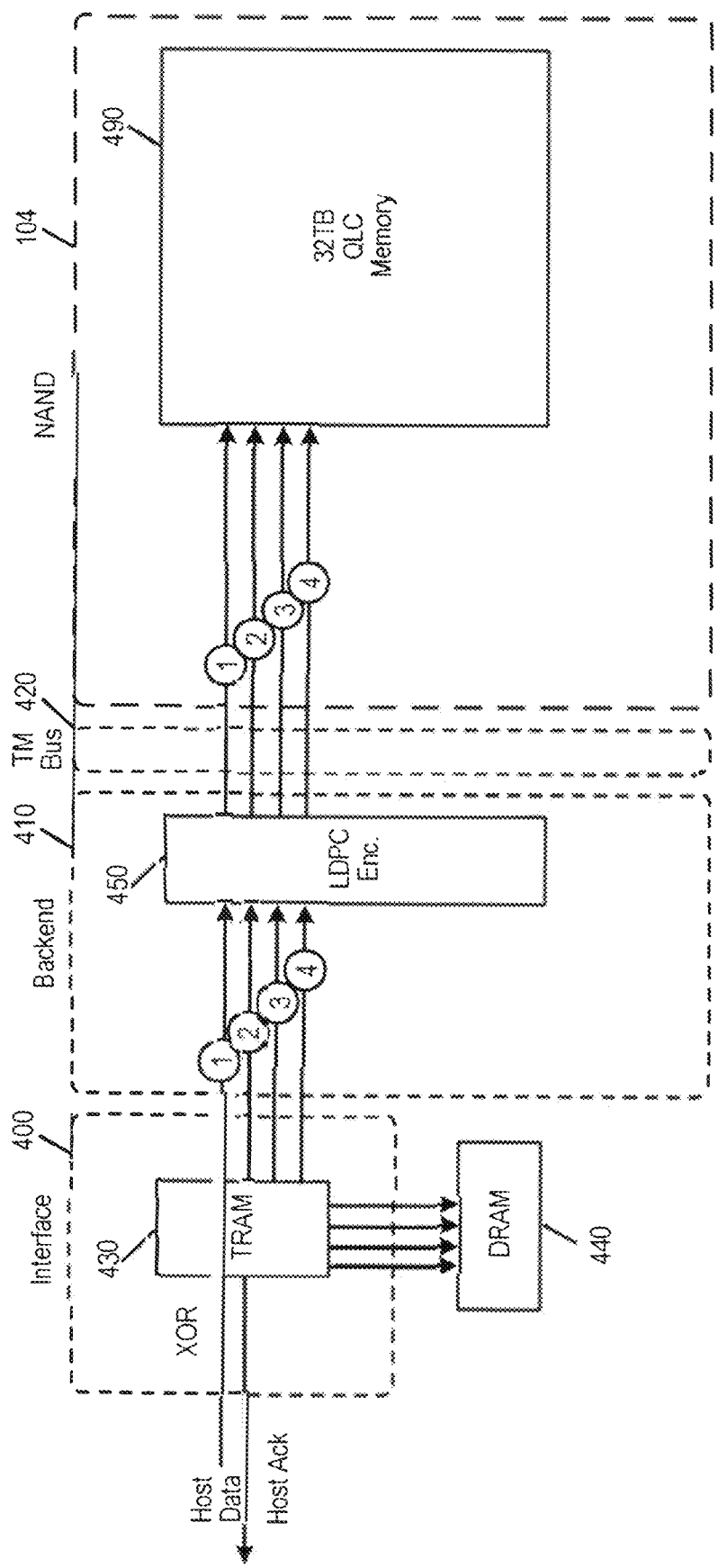
FIG. 3F is a Foggy-Fine data path diagram of an embodiment.

With respect to Foggy-Fine mode, FIG. 3D is a Foggy-Fine state diagram of an embodiment, and FIG. 3E is a Foggy-Fine data path diagram of an embodiment. As shown in FIG. 3E, in the Foggy-Fine data path in this embodiment, the host data is written to QLC memory directly (Data Paths 1-4), and the data from the DRAM 440 can be evicted right after the data is sent to the memory 104.

In another alternative, the storage system 100 is configured to provide a graceful shutdown command (sometimes referred to herein as a "PLP signal," "PLP command," "Pfail," or "graceful termination" command) in a power loss situation. A modified use of this operation can be used for the suspend/data reconstruction operations described above to reduce read latency. In this alternative, the command that triggers the suspend/data reconstruction operation can be considered a "fake power loss command for on-chip Pfail." The following paragraphs provide several examples of possible implementations in the context of a graceful shutdown command in a power loss situation. These implementations can be adapted in non-power-loss situations to reduce read latency in mixed read/write situations. For example, some features needed in the power loss situation may not be needed in the non-power-loss situation (e.g., reconstructed data may not need to be programming in SLC memory in the non-power-loss situation). These paragraphs also provide examples of various data reconstruction operations that can be used. It should be understood that details in the following paragraphs are merely examples and other implementations can be used.

The following paragraphs provide three techniques to protect the host data in case of a power loss event, and these techniques can be adopted for storage systems with different sizes of PLP capacitors. In these examples, a data reconstruction method is provided for QLC memory. It should be understood that these methods can be extended to other types of memory, such as, MLC memories. The term "MLC" will be used generically herein to refer to memory cells that can store two or more bits. So, TLC and QLC memory are forms of MLC memory. A memory cell that can store only two bits is also an MLC memory, and, in the below examples, MLC will refer to two-bites-per-cell. These examples can be expanded to other numbers of bits per cell (e.g., TLC-Fine mode, QLC-Fine mode, etc.). It should also be noted that techniques other than the three described below can be used, and the details provided below should not be read into the claims unless expressly recited therein.

Figure 6:
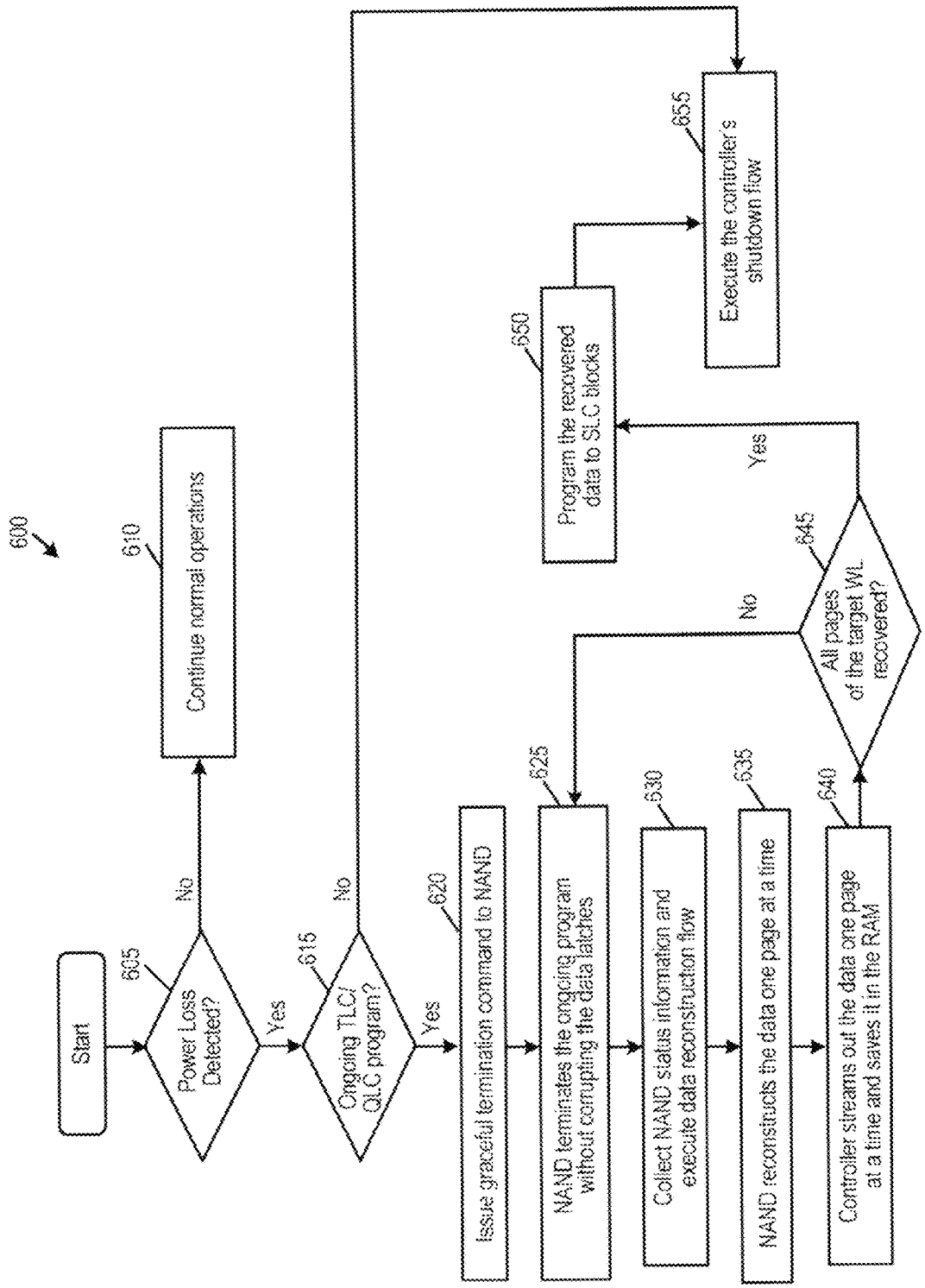
FIG. 6 is a flow chart of a method of an embodiment for data recovery before power down.

In one technique that includes data reconstruction in the latches and programming to SLC memory, upon receipt of the PLP signal, an ongoing program operation is interrupted, and data is reconstructed prior to power down. This technique does not require data transfer to DRAM to be backed-up. This technique is illustrated in the flow chart 600 in FIG. 6. As shown in FIG. 6, the controller 102 determines if a power loss event is detected (act 605). The controller 102 can determine this in any suitable way. For example, the controller 102 can monitor power coming from the host 300 across the bus/interface connecting the controller 102 to the host 300. As another example, the controller 102 can receive an indication from the host 300 that a power loss in imminent. When power loss occurs, PLP capacitors in the storage system 100 can continue to power the storage system 100, so it can perform the data protection operations described below.

If a power loss is not detected, the controller 102 continues its normal operations (act 610). However, if a power loss is detected, the controller 102 determines if there is an ongoing program operation to MLC (e.g., TLC or QLC) blocks in the memory 104 (act 615). If there isn't an ongoing program operation to the MLC blocks, the controller 102 executes a shutdown flow to shut down the storage system 100 (act 655). This may involve programming some data from SRAM/DRAM to SLC, but not the data in the latches (as there is none). However, if there is an ongoing program operation to MLC blocks, a data loss situation can arise. In programming MLC memory, several programming steps are performed (e.g., foggy-fine programming) to bring a memory cell to the correct state. If the program operation is interrupted prior to completing all of the programming steps, the memory cell will not store the correct state, resulting in data loss. There is no full back-up copy of the data in the latches either during the program.

To prevent such data loss in this embodiment, the controller 102 issues a graceful termination command to the memory 104 (act 620). In response to this command, the memory 104 terminates the ongoing program operation without corrupting the data latches (act 625). That is, the idea here is to finish the programming pulse, read the cells, and update the latches according to the cell's state. If the cell has reached its desired state, then all four bits for the cell will be set to "1'," thus disabling any further program. The data in the latches is not the original data, as the latches only contain data for the cells that are not yet fully programmed. The controller 102 or the memory 104 then collects memory status information and executes a data reconstruction flow (act 530). The collected memory status information specifies which memory cells have been completely programmed and specifies the data in the data latches for those memory cells that have not been completely programmed. Using this collected status information, the memory 104 reconstructs the data latches to contain the data that was to be programmed in the interrupted program operation one page at a time (act 635). The data reconstruction process is discussed in more detail below.

The controller 102 streams the reconstructed data out of the memory 104 one page at a time (in this example, there are four pages of data per wordline) and saves it in volatile memory (e.g., RAM) (act 640). The controller 102 then determines if all the pages of the target wordline have been recovered (act 645). If all the pages have not been recovered, the method loops back to act 625. However, if all the pages have been recovered, the controller 102 programs the recovered data to SLC blocks (which are faster to program that MLC blocks) in the memory 104 (act 650) and shuts the storage system 100 down (act 655).

In another technique, instead of reconstructing the data before shutdown, the storage system 100 saves the information about the interrupted program operation, saves the residual program data from the data latches to SLC blocks in the memory 104, and then powers down. The graceful-shutdown feature (see act 720) may still be used in this case, as some memory cells can be recently programmed but the latches not set to 1111. This discrepancy would result in an error, and too many errors like this may result in an uncorrectable error later. Because the data is not reconstructed prior to power down, the power down process in this technique is faster than in the technique discussed above. The storage system 100 reconstructs the data after power up by combining the residual data saved to the SLC blocks and reading back the subset of data actually programmed to the memory 104. The technique is illustrated in the flow chart 700 in FIG. 7.

Figure 7:
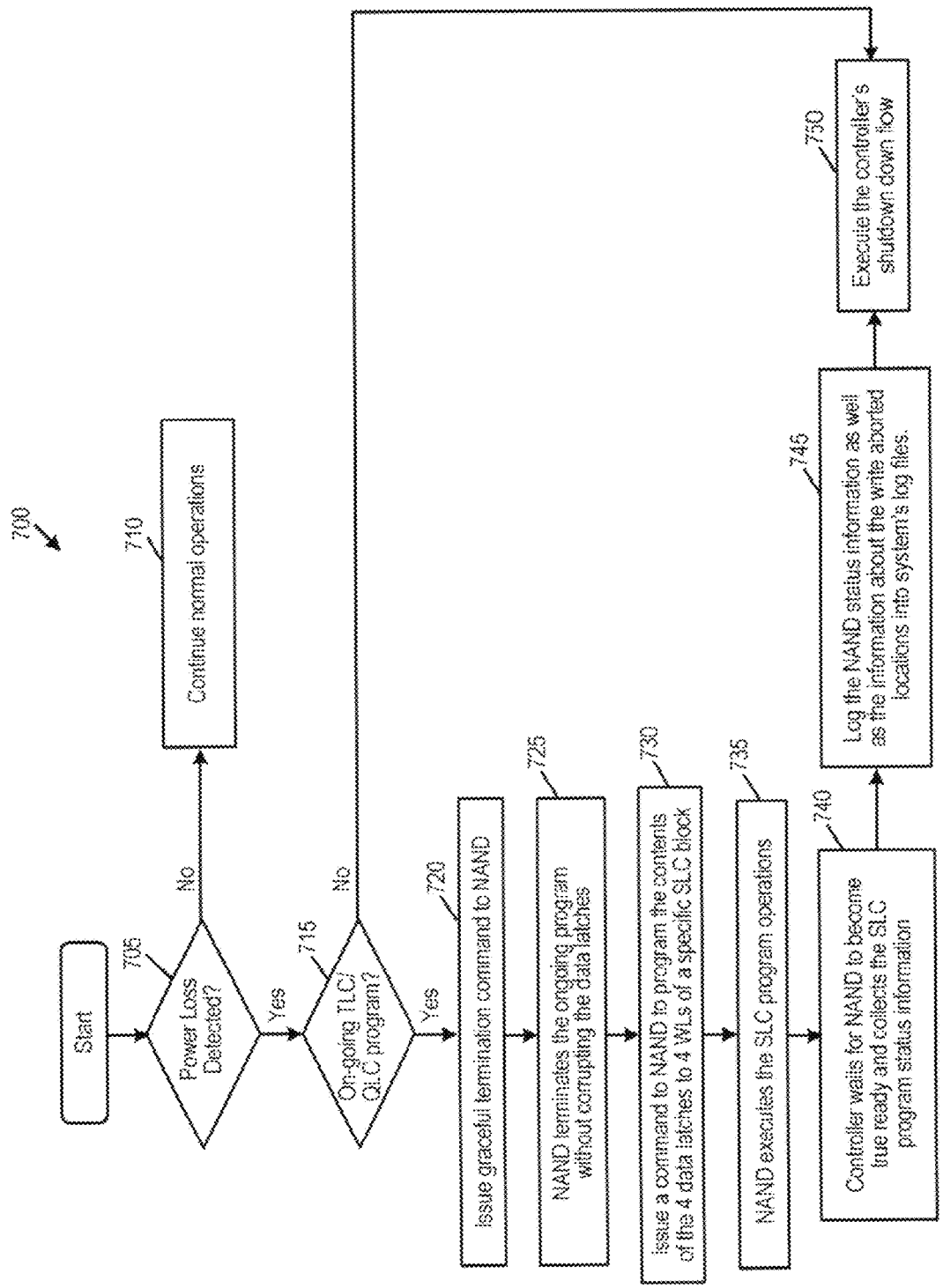
FIG. 7 is a flow chart of a method of an embodiment for data backup before power down.

As shown in FIG. 7, the controller 102 determines if a power loss event is detected (act 705). If a power loss is not detected, the controller 102 continues its normal operations (act 710). However, if a power loss is detected, the controller 102 determines if there is an ongoing program operation to MLC (e.g., TLC or QLC) blocks in the memory 104 (act 715). If there isn't an ongoing program operation to the MLC blocks, the controller 102 executes a shutdown flow to shut down the storage system 100 (act 750). However, if there is an ongoing program operation to MLC blocks, the controller 102 issues a graceful termination command to the memory 104 (act 720). In response to this command, the memory 104 terminates the ongoing program operation without corrupting the data latches (act 725).

Then, the controller 102 issues a command to the memory 104 to program the contents of the four data latches in the memory 104 to four wordlines in a specific SLC block (act 730). The memory 104 then executes the SLC program operations (act 740). The controller 102 waits for the memory 104 to become true ready and collects the SLC program status information (act 740). Then, the controller 102 logs the memory status information, as well as the information about the write-aborted locations, into the storage system's log files (act 745). The controller 102 then executes the shutdown flow to shut down the storage system 100 (act 750).

Figure 8:
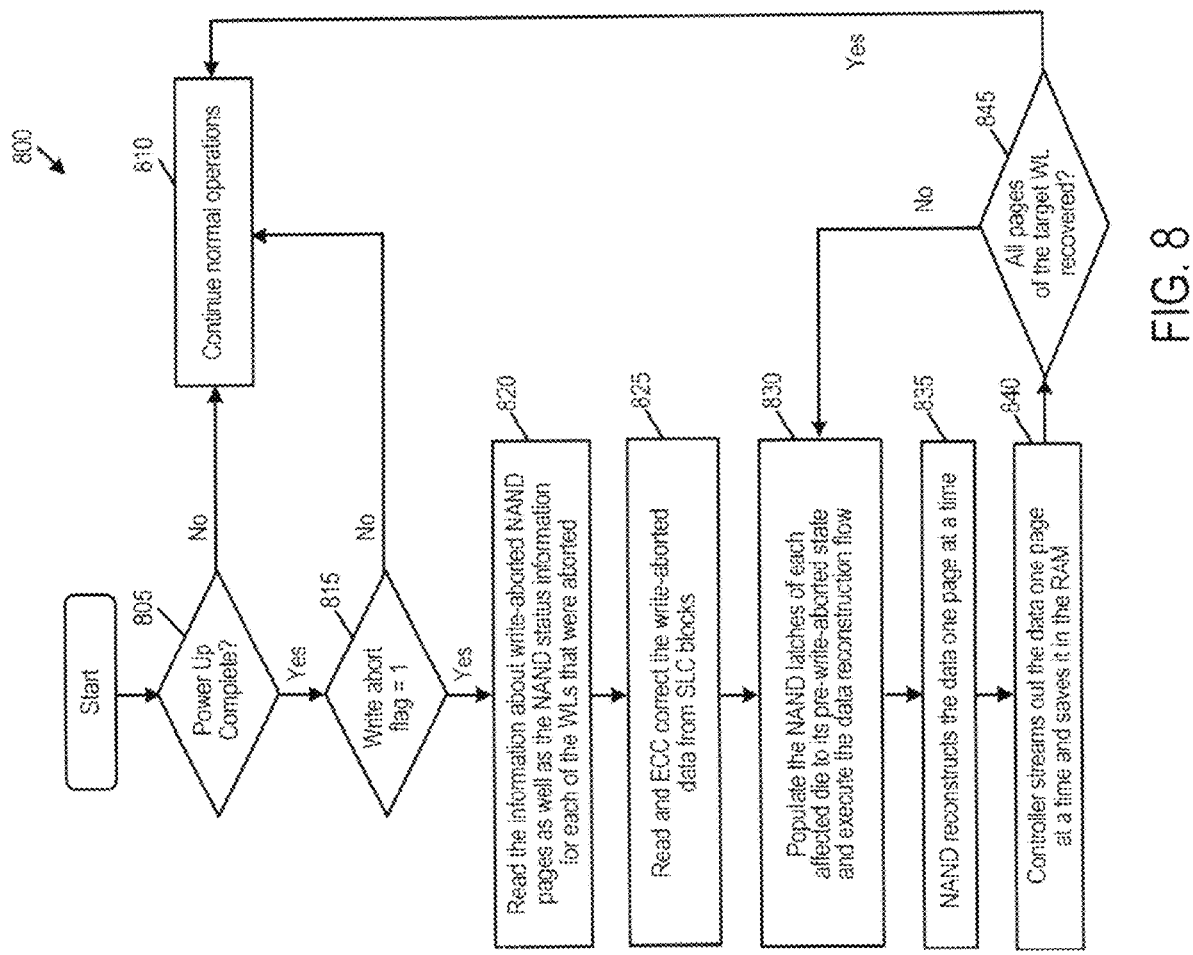
FIG. 8 is a flow chart of a method of an embodiment for data recovery after power up.

FIG. 8 is a flow chart 800 for recovering the data after power up. As shown in FIG. 8, after the storage system 100 powers up, the controller 102 determines if power up is complete (act 805). If power up is not complete, the controller 102 continues with its normal operations (act 810). However, if power up is complete, the controller 102 determines if a write-abort flag is set (e.g., in a register in the controller 102) (act 815). The write-abort flag can be set by the controller 102 if there was a graceful shutdown of the storage system 100. If the write-abort flag is not set, the controller 102 continues with its normal operations (act 810). However, if the write-abort flag is set, the controller 102 reads the information about the write-aborted memory pages, as well as the memory status information, for each of the wordlines that were aborted (act 820). Next, the memory 104 reads and ECC corrects the write-aborted data from the SLC blocks (act 825). The memory 104 then populates the data latches of each affected memory die to its pre-write-aborted state and executes the data reconstruction flow, an example of which is discussed below (act 830). It should be noted that this is not done for the first two methods discussed above: (1) reconstruct then program to SLC and (2) abort, program to SLC, then reconstruct. In (1), the SLC is read (containing full codewords) and corrected to get all the data. The data is then programmed to a normal (not aborted) data block (SLC or QLC) to free the special back-up SLC blocks. In (2), the SLC is read to get partial data (which is not a valid ECC codeword), and the QLC is read to get partial data (which is also not a valid ECC codeword), page by page. Then, reconstruction occurs to make a valid codeword, which can then be corrected and saved.

The memory 104 reconstructs the data one page at a time (act 835), and the controller 102 streams out the data one page at a time and saves it to volatile memory (e.g., RAM) (act 840). The controller 102 then determines if all pages of the target wordline have been recovered (act 845). If all pages of the target wordline have not been recovered, the method loops back to act 830. However, if all pages of the target wordline have been recovered, the data recovery process is complete, and the controller 102 continues its normal operations (act 810).

In the two techniques discussed above, data of an interrupted program operation to a wordline is reconstructed before (the first technique) or after (the second technique) the storage system 100 shuts down. FIGS. 9 and 10 illustrate one way in which the data can be reconstructed. It should be noted that this is merely one example, and other methods can be used.

In this example, when the controller 102 sends the data corresponding to all the pages for a target wordline, the memory 104 first stores it in four data latch sets. For example, for a QLC NAND with a 3255 state code, the state of the four data latches would be as shown in FIG. 9. Each data latch (DL1/2/3/4) contains one page of data, and S0-S15 represent the 16 states of the QLC word-line. After the data transfer from the controller 102 to the memory 104 is complete, the controller 102 issues the program command to the memory 103. The memory 104 may or may not convert the four pages of data into any intermediate state code that can help reduce the scan logic and area before executing the program operation.

During the program operation, the memory 104 executes a program subroutine and a verify subroutine during each loop of that operation. During the verify operation, the memory 104 senses the data of the target wordline and flips (to a value "1") the data latches of the memory cells that have reached their target Vt state. This process of program-and-verify is repeated multiple times until either all the data latches have flipped to "1" or until the maximum allowed loop count has been reached. If the controller 102 issues the "graceful stop" command to the memory 104 while a programming operation is in progress, the memory 104 will complete execution of the ongoing program loop and then terminate the state machine before going to the idle state. FIG. 10 shows the contents of the data latches after the "graceful stop" operation.

Figure 11:
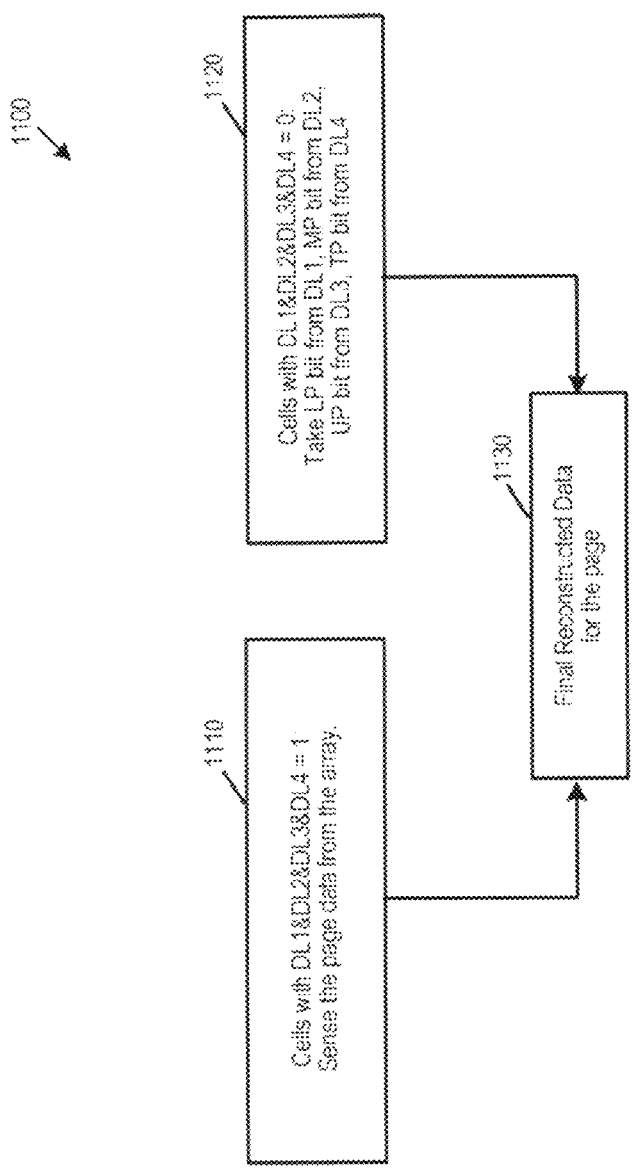
FIG. 11 is a flow chart of a data reconstruction method of an embodiment.

When the data reconstruction is desired, the storage system 100 will reconstruct all four pages of data, one page at a time. FIG. 11 is a flow chart 1100 of an example reconstruction method of an embodiment (other methods can be used). As shown in FIG. 11, the memory 104 senses the page data from cells that have been successfully programmed (act 1110). For those cells that have not been successfully programmed, the memory 104 takes the lower-page bit from DL1, the middle-page bit from DL2, the upper page bit form DL3, and the top-page bit from DL4 (act 1120). The information from both of these acts is then combined to generate the final reconstructed data for the page (act 1130). It should be noted that both parts of the data before the reconstruction are not codewords, so any error in those parts cannot be corrected.

The reconstruction method can be implemented in the memory 104 or in the controller 102 (e.g., in firmware). In the latter situation, the controller 102 can stream out the content of all the data latches into volatile memory (e.g., system RAM) first and then execute sense operations of S1 to S15 to reconstruct the data. This concept can be applied to a programming operation with one-bit per cell, two-bits per cell, three-bits per cell, etc. Also, this reconstruction concept can be extended to cover cache programming, where a subset of data latches may hold the data for the next programming operation. Right before the first, second, and third data latches are released, the memory 104 can internally allocate a three-bit, two-bit, or one-bit coding, respectively, to the Vt states that are yet to complete programming. In such a case, the controller 102 can collect the information about the memory's cache release status immediately after the graceful termination command is executed.

Depending upon the memory status, the controller 102 can execute one of the following flows. If the memory status indicates no cache was released, a four-page reconstruction flow is performed. If the memory status indicates the first cache was released, one page of cached data of the next wordline is recovered from DL4, and a three-bits-per-cell reconstruction flow is performed. If the memory status indicates the second cache was released, two pages of cached data of the next wordline are recovered from DL4 and DL3, and a two-bits-per-cell reconstruction flow is performed. If the memory status indicates the third cache was released, three pages of cached data of the next wordline are recovered from DL4/3/2, and a one-page reconstruction flow is performed.

The following paragraphs present another technique for data protection during power loss. By way of review, the two techniques discussed above involved a command from the controller 102 to the memory 104 for a graceful shutdown, resulting in an abort of an ongoing fine programming operation (after finishing the verify or program pulse) and updating the data latches as per the results of the read-and-verify operation. The recovery here is similar to the method discussed above where the data gets reconstructed after power up, with ECC correction after reconstruction. In the first technique, the memory 104 responded to the command by reading data from the programmed memory cell in the QLC memory immediately, storing that data in the corresponding data latches, reconstructing the fine data using the unprogrammed memory cells' data already present in the data latches, and programming the reconstructed page in the SLC memory. In the second technique, the memory 104 responded to the command by flushing the data in the data latches to SLC memory, reading the programmed data from the QLC memory into the data latches, and then flushing that data to the SLC memory, all without DRAM transfers. The fine data is reconstructed when the storage system 100 later powers up. In the third technique described below, the memory 104 responds to the command by programming the data in the latches to the SLC memory. At power up, the storage system 100 reads the QLC memory and reconstructs the data.

It should be noted that these techniques can be used in an MLC-Fine case, as well as a foggy-phase abort case, and additional steps may be required for an encoded foggy-fine situation. More specifically, fine-phase recovery in the foggy-fine program mode operates as discussed above. In the MLC-Fine programming mode, if MLC pages are already protected (in SLC) or can be saved in response to the graceful shutdown command (to SLC), then only the upper and top pages need to be recovered. In the encoded foggy-fine mode, the first and third data protection techniques can be used without parity, but parity can be used to allow more errors to be fixed. Additionally, the parity page can be used to recover the fine phase data (the same way as using foggy data, aborted fine can be more reliable than normal foggy). Power loss in the fine phase, which is usually the longer phase, may be the main problem.

Figure 12:
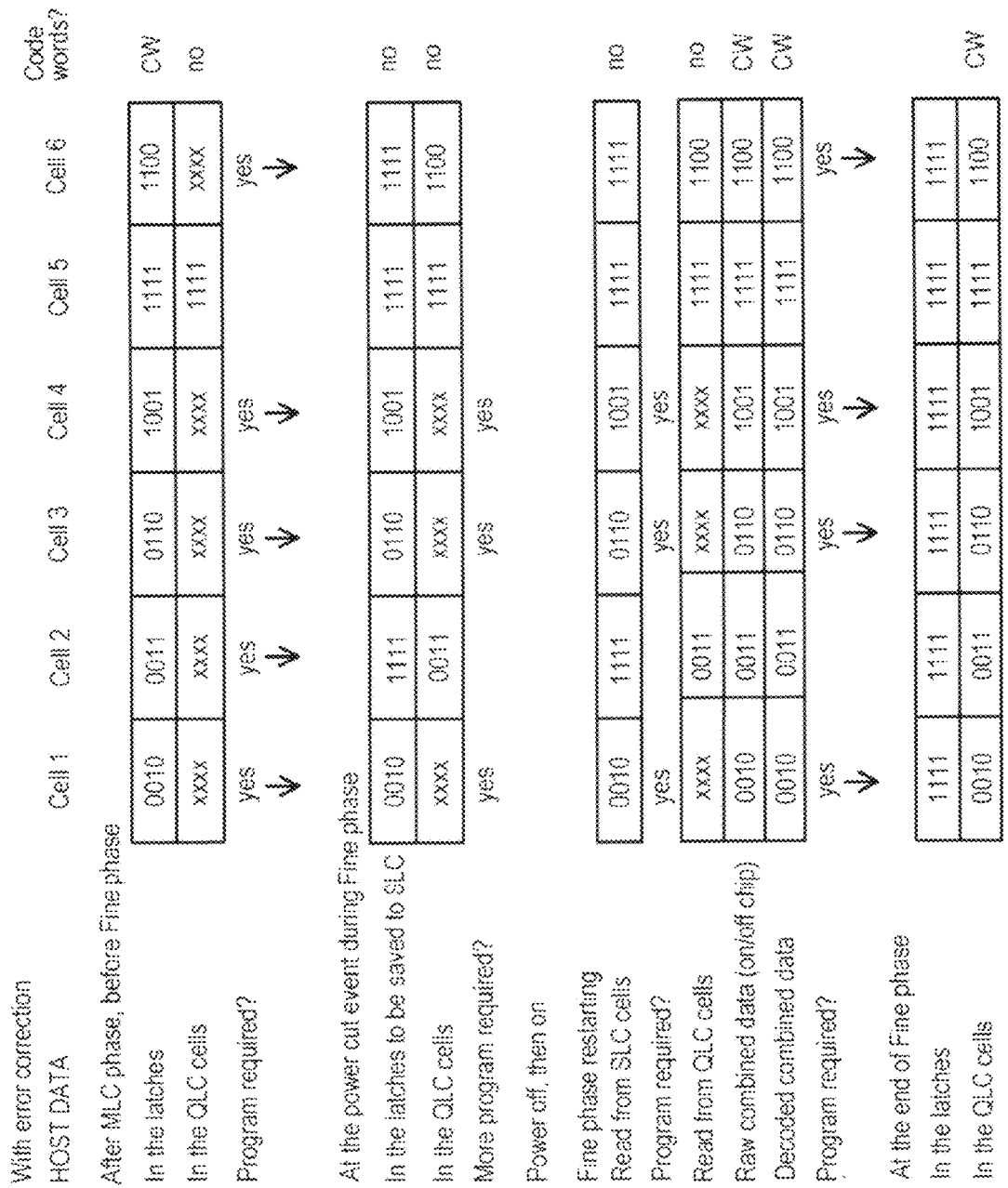
FIG. 12 is a chart illustrating a method of an embodiment for data protection during power loss.

Turning again to the drawings, FIG. 12 illustrates the third technique mentioned above for a fine programming operation with error correction. In this technique, in case of a power loss event during the fine programming phase, the memory 104 saves the data from the latches to the SLC block in the memory 104 (e.g., on the same die). When power is resumed, the memory 140 programs the data from the SLC block to the aborted wordline. The original data is then reconstructed in the latches. More specifically, if SLC=1111, data is taken from the QLC memory; otherwise, data is taken from the SLC memory. The data is the raw error correction code (ECC) codeword plus errors from the SLC and QLC memory. After the ECC errors are fixed, the original codeword is reconstructed. The data is then set to 1111 for the programmed cells, if necessary, and the aborted wordline is programmed. Reconstruction can be done off-chip or on-chip, which may involve the use of a fifth data latch and possibly test modes. The technique has the advantage of not needing to back-up data to volatile memory (DRAM), enabling an on-chip MLC read with extra error propagation risks and ECC protection at the possible cost of extra complexity in reconstructing the original data.

When power is back on, the storage system 100 reconstructs the original data in the latches. In this example, the four saved pages are read from the SLC memory and stored in the data latches. If the bits equal 1111 in all four pages (e.g., uLP&uMP& uUP&uTP=1), where the "u" is an unprogrammed data page, the data is taken from the QLC memory (because it was successfully programmed there prior to shut down). Otherwise, the data is read from the SLC memory. As shown in the chart in FIG. 13, in one example implementation, a Programmed Flag is used to indicate programming status. Here, the Programmed Flag=LP&MP&UP&TP, where "1" means no extra program is necessary (i.e., data in QLC wordline can be used for this bit), and 0 means that the QLC wordline data should be ignored, as the SLC wordline contains the correct data.

Then, page by page (for the lower page), a combined page can be generated as ((Not PF) AND (uLP)) OR ((PF) AND (QLC LP), as indicated in the table in FIG. 13. In order to do this on-chip, this operation can be broken down into steps to use the existing data latches (e.g., 3 or 4 latches). The recovered LP data is now raw ECC codewords containing errors from the SLC and QLC memory. The ECC errors are then fixed, and the original codewords are reconstructed. Then, the data is set to 1111 for the programmed cells, if necessary, and the data is programmed to the aborted wordline.

As mentioned above, while the previous example was discussed in terms of a write abort during fine programming mode, foggy-phase abort solutions can also be used. These solutions can be applicable to encoded foggy-fine programming if an extra parity bit is needed. The same sequence can be used as discussed above for the fine phase recovery with the following additional steps: programmed cells' data are read from QLC, foggy levels (if the third technique is used) from SLC memory are used, unprogrammed cells' data is read from the SLC, the data is combined as discussed above, the parity page is read out and corrected, the parity is used to modify the foggy data to fine data, which becomes ECC codewords, and the fine data is corrected.

Figure 14:
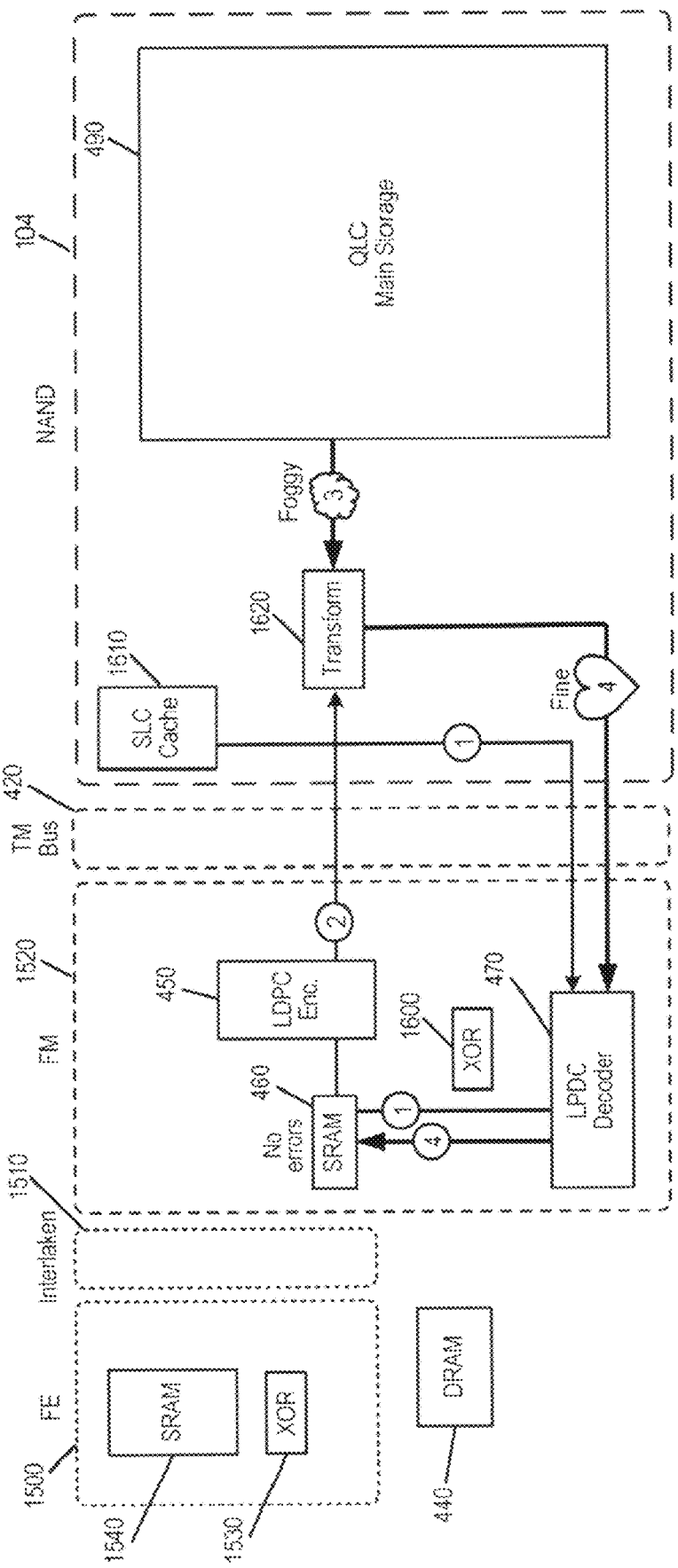
FIG. 14 is a block diagram illustrating a data path for reading a foggy wordline in a storage system of an embodiment.

FIG. 14 illustrates possible data paths for reading foggy wordlines (e.g., after bake). Here, the foggy data is not a codeword, and ECC correction can be done after the transformation to fine data. The foggy-fine method is based on foggy being not a valid codeword in all cases, as about 50% of the cells are in the wrong state (one state below the target) after the foggy phase. As shown in FIG. 14, in Data Path 1, data is read from the SLC cache 1610, processed by the LPDC encoder 470, and stored in SRAM 460. This is data reconstruction for the encoded foggy-fine method only. In the encoded foggy-fine method, data may be encoded prior to being foggy programmed (e.g., by generating parity data), so that when a read of foggy-programmed memory cells (in first distributions) is performed, the results of that read (a foggy read) may be decoded (e.g., combined with parity data) to recover the original data. On-chip circuits may be provided to perform such encoding (e.g., XOR circuits) and decoding, so that resources are efficiently used, and excessive transfer of data (e.g., through the memory bus) is avoided. Parity data may be stored on-chip in some cases (e.g., in a portion of a non-volatile memory structure that is configured for SLC storage). In some cases, parity data may be corrected (decoded) by ECC circuits prior to being used for recovery of data. Parity data may also be stored off-chip (e.g., in DRAM).

In Data Path 2, the data is read from the SRAM 460, processed by the LDPC encoder 450, and then sent to the transform module 1620. In Data Path 3, foggy data is read from the QLC memory 490 and sent to the transform module 1620. In Data Path 4, the transformed fine data is sent to the LDPC decoder 470, and the decoded data is stored in the SRAM 460.

Figure 15:
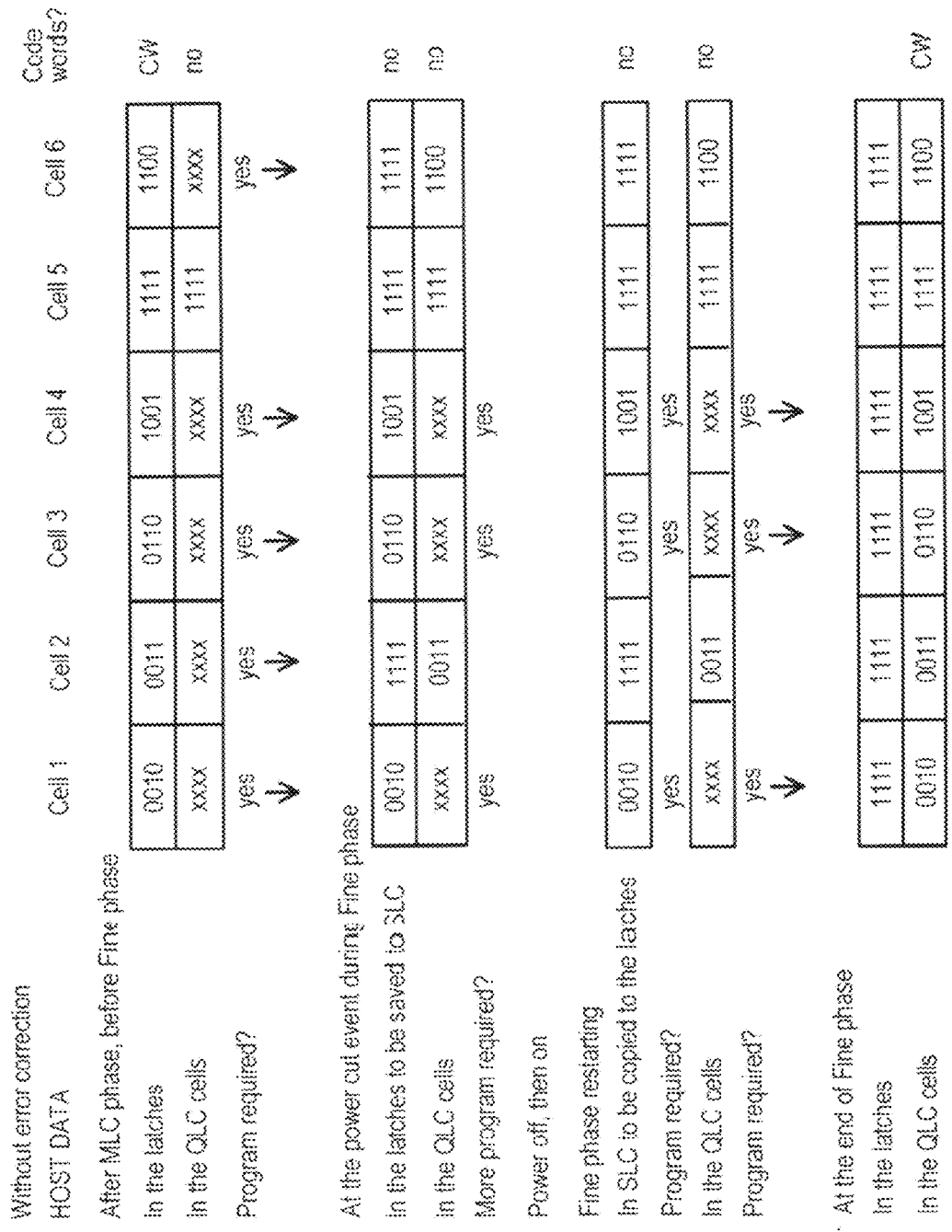
FIG. 15 is a chart illustrating a method of an embodiment for data protection during power loss.

Turning again to the drawings, FIG. 15 is a chart illustrating a MLC-Fine on-chip Pfail scram without error correction. In this embodiment, in case of a power loss event during the fine phase, data from the latches is saved to the SLC block on the same die. When power is on again, the data is read from the SLC block and programmed to the aborted wordline as-is without error correction. This provides the advantage of not needing to back up data in the DRAM and enabling on-chip MLC read with its own error propagation risks. However, the SLC data and the aborted fine data are not ECC protected, and the combined SLC and aborted fine data cannot be corrected after program. So, with these embodiments, the data recovery scheme that is used can be chosen based on the error rate.

Finally, as mentioned above, any suitable type of memory can be used. Semiconductor memory devices include volatile memory devices, such as dynamic random access memory ("DRAM") or static random access memory ("SRAM") devices, non-volatile memory devices, such as ReRAM, electrically erasable programmable read only memory ("EEPROM"), flash memory (which can also be considered a subset of EEPROM), ferroelectric random access memory ("FRAM"), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional (2D) memory structure or a three dimensional (3D) memory structure.

In a 2D memory structure, the semiconductor memory elements are arranged in a single plane or a single memory device level. Typically, in a 2D memory structure, memory elements are arranged in a plane (e.g., in an x-z direction plane) that extends substantially parallel to a major surface of a substrate that supports the memory elements. The substrate may be a wafer over or in which the layer of the memory elements is formed or it may be a carrier substrate that is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A 3D memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements in each column. The columns may be arranged in a 2D configuration, e.g., in an x-z plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the 2D and 3D structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, which are intended to define the scope of the claimed invention. Finally, it should be noted that any aspect of any of the embodiments described herein can be used alone or in combination with one another.

What is claimed is:

1. A storage system comprising:
   a memory comprising data latches and a plurality of wordlines; and a processor configured to:
receive a read command from a host;
determine that execution of the read command requires reading a wordline that is undergoing an ongoing programming operation to program data from the data latches to the wordline;
send a command to the memory, wherein the memory is configured to abort the ongoing programming operation in response to receiving the command, wherein aborting the ongoing programming operation results in some, but not all, memory cells in the wordline being successfully programmed;
reconstruct the data that was to be programmed in the wordline from the data latches that correspond to memory cells in the wordline that were not successfully programmed and from the memory cells in the wordline that were successfully programmed; and
send the reconstructed data to the host in response to the read command;
wherein the memory is further configured to reconstruct the data one page at a time and the processor is further configured to stream the reconstructed data out of the wordline one page at a time into a host read buffer prior to sending the reconstructed data to the host.

2. The storage system of claim 1, wherein the processor is further configured to determine whether a time to complete the ongoing programming operation exceeds a threshold amount of time.

3. The storage system of claim 2, wherein the command is sent to the memory in response to the time to complete the ongoing programming operation exceeding the threshold amount of time.

4. The storage system of claim 1, wherein the ongoing programming operation is aborted without corrupting the data latches.

5. The storage system of claim 1, wherein the processor is further configured to send the reconstructed data to the host after determining that all pages of the wordline have been recovered.

6. The storage system of claim 1, wherein the processor is further configured to determine that a memory cell in the wordline was successfully programmed in response to a program restart.

7. The storage system of claim 1, wherein the memory comprises a single-level cell (SLC) memory and a multi-level cell (MLC) memory.

8. The storage system of claim 1, wherein the memory comprises a three-dimensional memory.

9. In a storage system comprising a controller and a memory comprising data latches and a plurality of wordlines, a method comprising:
determining that execution of a read command received from a host requires reading a wordline that is undergoing an ongoing programming operation to program data from the data latches to the wordline; and
in response to determining that execution of the read command requires reading the wordline that is undergoing the ongoing programming operation, reducing read latency by:
faking a power loss situation by sending a graceful shutdown command from the controller to the memory even though the storage system is not undergoing power loss, wherein, in response to the graceful shutdown command, the memory aborts the ongoing programming operation, which results in some, but not all, memory cells in the wordline being successfully programmed;
reconstructing the data that was to be programmed in the wordline from the data latches that correspond to memory cells in the wordline that were not successfully programmed and from the memory cells in the wordline that were successfully programmed; and
sending the reconstructed data to the host.

10. The method of claim 9, further comprising determining whether a time to complete the ongoing programming operation exceeds a threshold amount of time.

11. The method of claim 10, wherein the graceful shutdown command is sent to the memory in response to the time to complete the ongoing programming operation exceeding the threshold amount of time.

12. The method of claim 9, wherein the ongoing programming operation is aborted without corrupting the data latches.

13. The method of claim 9, further comprising reconstructing the data one page at a time and streaming the reconstructed data out of the wordline one page at a time into a host read buffer prior to sending the reconstructed data to the host.

14. The method of claim 9, further comprising sending the reconstructed data to the host after determining that all pages of the wordline have been recovered.

15. The method of claim 9, further comprising determining that a memory cell in the wordline was successfully programmed in response to a program restart.

16. The method of claim 9, further comprising logging memory status information and information about write-aborted locations.

17. The method of claim 9, wherein the memory comprises a single-level cell (SLC) memory and a multi-level cell (MLC) memory.

18. The method of claim 9, wherein the memory comprises a three-dimensional memory.

19. A storage system comprising:
a memory comprising data latches and a plurality of wordlines; and
means for:
determining that execution of a read command received from a host requires reading a wordline that is undergoing an ongoing programming operation to program data from the data latches to the wordline; and
in response to determining that execution of the read command requires reading the wordline that is undergoing the ongoing programming operation, reducing read latency by:
faking a power loss situation by sending a graceful shutdown command to the memory even though the storage system is not undergoing power loss, wherein, in response to the graceful shutdown command, the memory aborts the ongoing programming operation, which results in some, but not all, memory cells in the wordline being successfully programmed;
sending a command to the memory, wherein, in response to the command, the memory aborts the ongoing programming operation, which results in some, but not all, memory cells in the wordline being successfully programmed;
reconstructing the data that was to be programmed in the wordline from the data latches that correspond to memory cells in the wordline that were not successfully programmed and from the memory cells in the wordline that were successfully programmed; and
sending the reconstructed data to the host.

\* \* \* \* \*